(12) United States Patent
Leeser (10) Patent No.: US 10,139,132 B2
(45) Date of Patent: Nov. 27, 2018

(54) APPARATUS FOR THERMAL CONTROL OF TUBING ASSEMBLY AND ASSOCIATED METHODS

(71) Applicant: Lam Research Corporation, Fremont, CA (US)

(72) Inventor: Karl F. Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 598 days.

(21) Appl. No.: 14/675,603

(22) Filed: Mar. 31, 2015

(65) Prior Publication Data

US 2016/0290677 A1    Oct. 6, 2016

(51) Int. Cl.
| | |
|---|---|
| *F24H 1/10* | (2006.01) |
| *F24H 3/08* | (2006.01) |
| *H01J 37/32* | (2006.01) |
| F16L 53/38 | (2018.01) |

(52) U.S. Cl.
CPC .......... *F24H 3/081* (2013.01); *H01J 37/3244* (2013.01); *F16L 53/38* (2018.01)

(58) Field of Classification Search
CPC ....... F24H 3/081; H01J 37/3244; H01J 17/04; B23P 15/26; C23C 16/45561
USPC ........ 219/228, 528, 535; 392/465, 468, 469, 392/478, 488
See application file for complete search history.

(56) References Cited

U.S. PATENT DOCUMENTS

| | | | | |
|---|---|---|---|---|
| 2010/0290764 A1* | 11/2010 | Borgmeier | .............. | F16L 25/01 392/468 |
| 2013/0294757 A1* | 11/2013 | Westmeier | ............ | F16L 11/127 392/468 |
| 2017/0122477 A1* | 5/2017 | Viellard | ................ | F16L 53/008 |

FOREIGN PATENT DOCUMENTS

| | | | | |
|---|---|---|---|---|
| CN | 201402739 Y | 2/2010 | | |
| CN | 102818094 A | 12/2012 | | |
| CN | 103282712 A | 9/2013 | | |
| DE | 202010012446 U1 | 2/2012 | | |
| DE | 202012101468 U1 | 9/2013 | | |
| GB | 2526831 A | * | 12/2015 | ............ F16L 59/163 |
| JP | 3787072 B2 | 8/2002 | | |

* cited by examiner

*Primary Examiner* — Thien S Tran
(74) *Attorney, Agent, or Firm* — Martine Penilla Group, LLP (57) ABSTRACT

A tubing assembly includes a plurality of tubing structures connected to each other in a configuration providing one or more fluid pathways through the plurality of tubing structures from a fluid entrance to a fluid exit of the plurality of tubing structures. An electrical resistance heating filament wire is wound around the plurality of tubing structures in an unbroken manner from the fluid entrance to the fluid exit. The electrical resistance heating filament wire has a first electrical lead located proximate to the fluid entrance of the plurality of tubing structures and a second electrical lead located proximate to the fluid exit of the plurality of tubing structures. An encapsulation layer of thermal insulating material is disposed over an entirety of the plurality of tubing structures and covers the electrical resistance heating filament wire wound around the plurality of tubing structures with the first and second electrical leads exposed.

14 Claims, 10 Drawing Sheets

APPARATUS FOR THERMAL CONTROL OF TUBING ASSEMBLY AND ASSOCIATED METHODS

BACKGROUND

1. Field of the Invention

The present invention relates to semiconductor chip fabrication facilities.

2. Description of the Related Art

Many modern semiconductor chip fabrication processes require process gases and/or liquids to be supplied in a carefully controlled manner to a reaction chamber in which the process gases and/or liquids are applied to affect processing of a semiconductor wafer. Provision of the process gases and/or liquids to the reaction chambers can include controlling a temperature of the process gases and/or liquids in route to the reaction chamber and just prior to input into the reaction chambers. It is within this context that the present invention arises.

SUMMARY

In one example embodiment, a tubing assembly is disclosed. The tubing assembly includes a plurality of tubing structures connected to each other in a configuration providing one or more fluid pathways through the plurality of tubing structures from a fluid entrance of the plurality of tubing structures to a fluid exit of the plurality of tubing structures. The tubing assembly includes an electrical resistance heating filament wire wound around the plurality of tubing structures in an unbroken manner from the fluid entrance of the plurality of tubing structures to the fluid exit of the plurality of tubing structures. The electrical resistance heating filament wire has a first electrical lead located proximate to the fluid entrance of the plurality of tubing structures and a second electrical lead located proximate to the fluid exit of the plurality of tubing structures. The tubing assembly includes an encapsulation layer of thermal insulating material disposed over an entirety of the plurality of tubing structures and covering the electrical resistance heating filament wire wound around the plurality of tubing structures with the first and second electrical leads exposed.

In one example embodiment, a method is disclosed for manufacturing a tubing assembly. The method includes connecting a plurality of tubing structures together in a tubing assembly configuration providing one or more fluid pathways through the plurality of tubing structures from a fluid entrance of the plurality of tubing structures to a fluid exit of the plurality of tubing structures. The method includes winding an electrical resistance heating filament wire around the plurality of tubing structures in an unbroken manner from the fluid entrance of the plurality of tubing structures to the fluid exit of the plurality of tubing structures, such that the electrical resistance heating filament wire has a first electrical lead located proximate to the fluid entrance of the plurality of tubing structures and a second electrical lead located proximate to the fluid exit of the plurality of tubing structures. The method includes applying an encapsulation layer of thermal insulating material over an entirety of the plurality of tubing structures in a manner to cover the electrical resistance heating filament wire wound around the plurality of tubing structures and leave the first and second electrical leads exposed.

In one example embodiment, a system for manufacturing a tubing assembly is disclosed. The system includes a winding apparatus configured to wind an electrical resistance heating filament wire around a tubing assembly as the tubing assembly is moved through the winding apparatus. The tubing assembly includes a plurality of tubing structures connected to each other in a configuration providing one or more fluid pathways through the plurality of tubing structures from a fluid entrance of the plurality of tubing structures to a fluid exit of the plurality of tubing structures. The winding apparatus includes an open bore within which the electrical resistance heating filament wire is wound around the tubing assembly as the tubing assembly passes through the open bore. The system includes a tubing assembly handling apparatus configured to hold the tubing assembly and direct movement of the tubing assembly through the open bore of the winding apparatus. The system includes a winding control system configured to control operation of the winding apparatus and the tubing assembly handling apparatus. The winding control system is configured to control a rate at which the electrical resistance heating filament wire is wound around the tubing assembly as the tubing assembly passes through the open bore. The winding control system is also configured to control a rate at which the tubing assembly is moved through the open bore of the winding apparatus. The winding control system is configured to be programmable such that movement of the tubing assembly through the open bore of the winding apparatus as the electrical resistance heating filament wire is wound around the tubing assembly by the winding apparatus is performed in an automated manner in accordance with a program executed by the winding control system.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
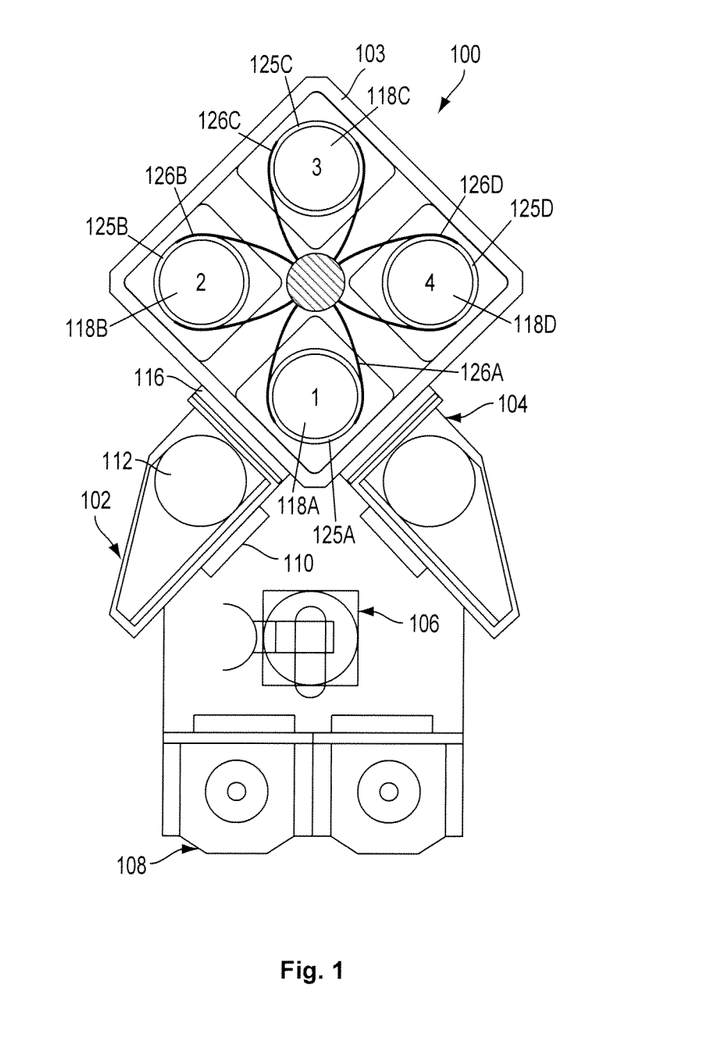
FIG. 1 shows a schematic top view of an example embodiment of a multi-station processing tool within a semiconductor fabrication facility.

FIG. 1 shows a schematic top view of an example embodiment of a multi-station processing tool 100 within a semiconductor fabrication facility. The multi-station processing tool 100 includes an inbound load lock 102 and an outbound load lock 104. A robot 106, at atmospheric pressure, is configured to move a substrate, e.g., semiconductor wafer, from a cassette loaded through a pod 108 into inbound load lock 102 via an atmospheric port 110, and place the substrate on a support 112 within the inbound load lock 102. Inbound load lock 102 is coupled to a vacuum source (not shown) so that, when atmospheric port 110 is closed, inbound load lock 102 may be pumped down. Inbound load lock 102 also includes a chamber transport port 116 interfaced with processing chamber 103. Thus, when chamber transport port 116 is opened, another robot (not shown) may move the substrate from inbound load lock 102 to a substrate support 118 of a first process station 1 for processing. The example processing chamber 103 includes four process stations, numbered from 1 to 4. It should be appreciated, however, that other embodiments of the processing chamber 103 can include more or less process stations, and can be arranged in configurations different than what is shown by way of example for the processing tool 100 in FIG. 1.

In some embodiments, processing chamber 103 may be configured to maintain a low pressure environment so that substrates may be transferred among the process stations 1-4 within the processing chamber 103 using carrier rings 125A-125D and spider forks 126A-126D without experiencing a vacuum break and/or air exposure. The spider forks 126A-126D rotate and enable transfer of substrates between process stations. The transfer occurs by enabling the spider forks 126A-126D to lift the carrier rings 125A-125D from an outer undersurface, which lifts the substrates, and rotates the substrates and carrier rings 125A-125D together to the next process station. Each process station depicted in FIG. 1 includes a process station substrate support 118A-118D and process fluid supply lines and removal lines. It should be appreciated that the processing tool 100 and each of the process stations 1-4 represents a very complex system including numerous interrelated and interfacing components. In order to avoid unnecessarily obscuring the present invention, details of the processing stations 1-4 and other interrelated and interfacing components are not further described herein.

Each process station 1-4 can be defined to perform one or more substrate processing/manufacturing operations. The processing/manufacturing operations performed by the process stations 1-4 can include utilization of various fluids (gases and/or liquids) which are delivered to and removed from the process stations 1-4 by various tubing arrangements. For example, with reference back to FIG. 1, within the semiconductor fabrication facility, the spaces between, above, below, around, and within the processing tool 100 and its various process stations 1-4 can include a complex network of tubing for delivering various process gases and/or liquids to the various process stations and for removing various process gases and/or liquids from the various process stations 1-4.

In some embodiments, portions of this network of tubing needs to be temperature controlled so as to establish and control temperatures of the various process fluids prior to their arrival at the various process stations 1-4. In some embodiments, tubing is heated and insulated to affect heating of the various process fluids as they travel through the tubing network to the process stations 1-4. In some embodiments, the heating of the tubing is provided by electrical resistance heaters in contact with or in close proximity to the tubing. In such embodiments, the tubing is metallic or made of a material suitable to withstand exposure to the heat flux emanating from the electrical resistance heaters.

In some embodiments, portions of the tubing network used to convey various process fluids to and/or from the process stations 1-4 are fabricated as separate tubing assemblies outside of the semiconductor fabrication facility. The separate tubing assemblies are then fit together within the semiconductor fabrication facility to form the required network of tubing for delivery of various process fluids to the process stations 1-4 and/or for removal of various process fluids from the process stations 1-4. Some sections or flow paths of the tubing network may need to be temperature controlled. The tubing assemblies within these temperature controlled sections of the tubing network can be fabricated with integral heating components. In some embodiments, the integral heating components of various tubing assemblies can be connected together as the various tubing assemblies are fit together within the semiconductor fabrication facility, so as to form an electrical heating circuit for sections of the tubing network. And, the electrical heating circuit can be connected to a control system for controlling the heating of the tubing, which in turn controls the temperature of the fluids being delivered to and/or removed from the process stations 1-4.

Figure 2:
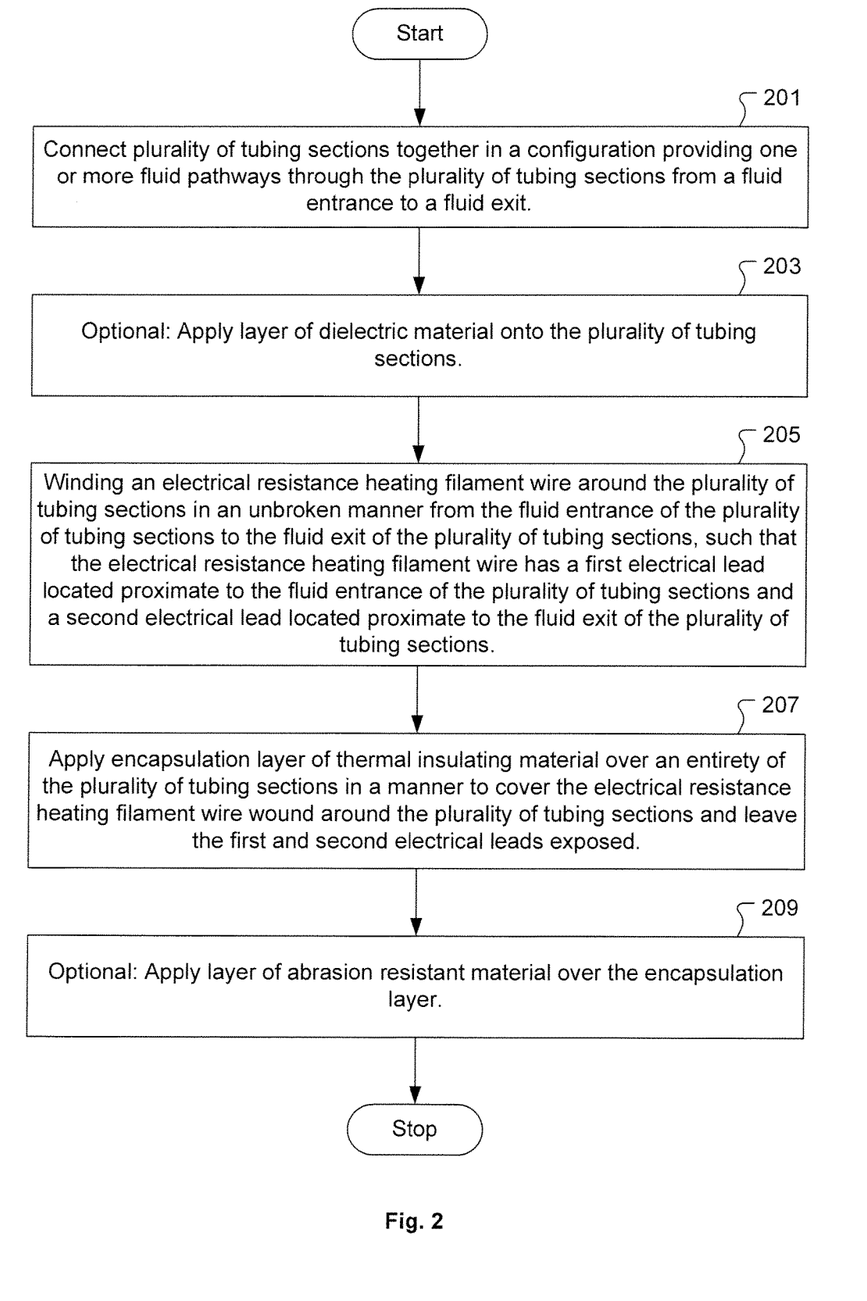
FIG. 2 shows a flowchart of a method for manufacturing a tubing assembly with integral heating components, in accordance with some example embodiments of the present invention.
Figure 3:
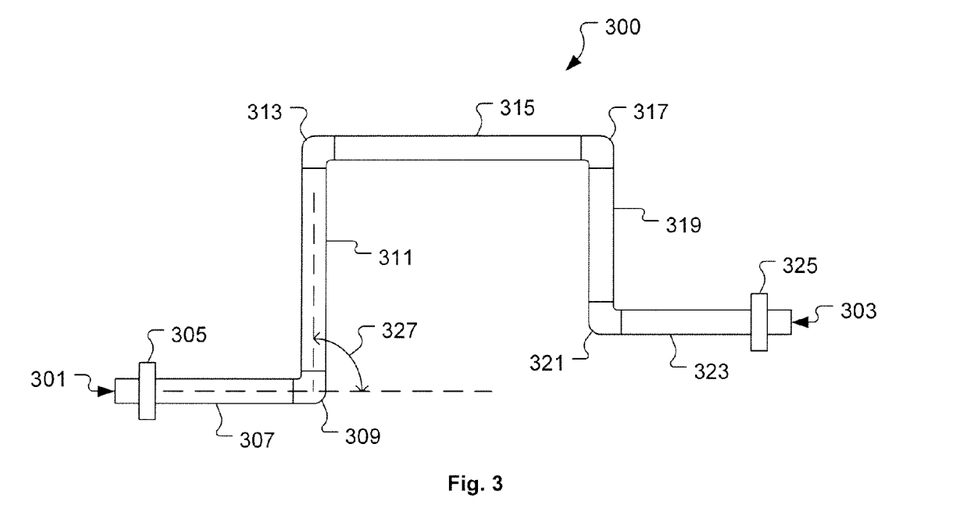
FIG. 3 shows an example tubing assembly, in accordance with an example embodiment of the present invention.

FIG. 2 shows a flowchart of a method for manufacturing a tubing assembly with integral heating components, in accordance with some example embodiments of the present invention. The method includes an operation 201 for connecting a plurality of tubing structures together in a tubing assembly configuration providing one or more fluid pathways through the plurality of tubing structures from a fluid entrance of the plurality of tubing structures to a fluid exit of the plurality of tubing structures. FIG. 3 shows an example tubing assembly as connected together in operation 201, in accordance with an example embodiment of the present invention. The tubing assembly 300 includes tubing structures 305, 307, 309, 311, 313, 315, 317, 319, 321, 323, and 325 connected together to provide a fluid pathway through the tubing assembly 300 from a fluid entrance 301 to a fluid exit 303. In some embodiments, the tubing structures of the tubing assembly 300 are welded together to form a weldment. However, in other embodiments, some or all of the tubing structures can be connected together using non-welding techniques, such as by brazing or soldering. Also, in some embodiments, one or more of the tubing structures can include an end flange structure to provide for assembly using a gasket/seal-ring and fasteners such as bolts.

It should be understood that the number of tubing structures and their configuration as depicted in the tubing assembly 300 of FIG. 3 is for purposes of description and is not intended to place any limit or restriction on how the tubing assembly can be configured in operation 201. The tubing assembly configuration as connected together in operation 201 can include any number of tubing structures, any shape of tubing structure, and any size of tubing structure, and can be put together using any assembly/connection process. In some embodiments, however, the tubing assembly configuration as connected in operation 201 includes at least two tubing structures that are connected within the tubing assembly in an angled configuration relative to each other such that an angle of less than 180 degrees exists between axial centerlines of the at least two tubing structures. For example, the tubing assembly 300 of FIG. 3 shows tubing structures 307 and 311 that are connected at an angled configuration relative to each other such that an angle 327 of less than 180 degrees exists between their axial centerlines.

Figure 4:
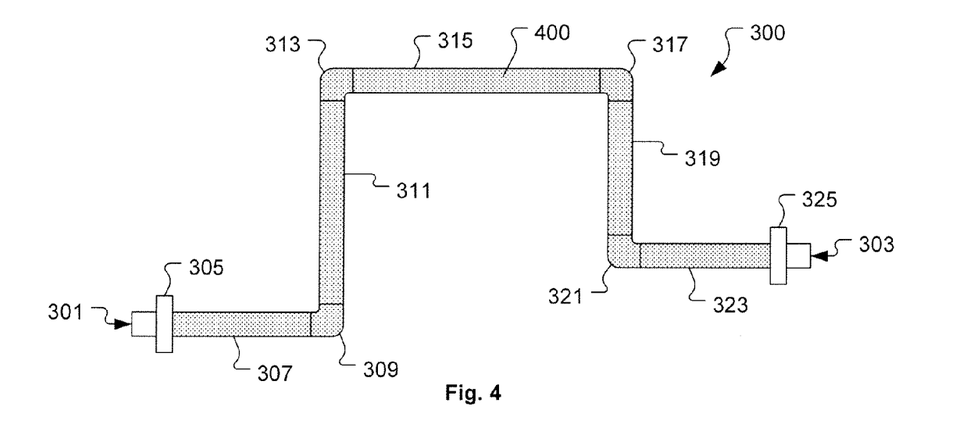
FIG. 4 shows the tubing assembly of FIG. 3 with a layer of dielectric material applied to the external surfaces of the tubing structures.

The method of FIG. 2 can also include an optional operation 203 for applying a layer of a dielectric material onto the plurality of tubing structures before winding of electrical resistance heating filament wire around the plurality of tubing structures. FIG. 4 shows the tubing assembly 300 of FIG. 3 with a layer of dielectric material 400 applied to the external surfaces of the tubing structures 307, 309, 311, 313, 315, 317, 319, 321, 323. In some embodiments, the operation 203 can be performed to apply the layer of the dielectric material to some of the tubing structures while not applying the layer of the dielectric material to some of the tubing structures. For example, FIG. 4 shows that the layer of the dielectric material is not applied to the tubing structures 305 and 325. In some embodiments, the operation 203 can be performed to apply the layer of the dielectric material to all of the tubing structures. The dielectric material applied in the operation 203 is both electrically insulating and thermally conductive. In some embodiments, the dielectric material applied in the operation 203 can be polyimide. However, it should be appreciated that in other embodiments the dielectric material applied in the operation 203 can be essentially any type of dielectric material that is capable of transferring heat emanating from electrical resistance heating filament wire to the tubing structures while also providing a required amount of electrical insulation. In various embodiments, the dielectric material can be applied in the operation 203 to have a thickness with a range extending from about 10 microns to about 500 microns. However, it should be understood that in other embodiments the dielectric material can be applied in the operation 203 to have a thickness greater than 500 microns.

Figure 5A:
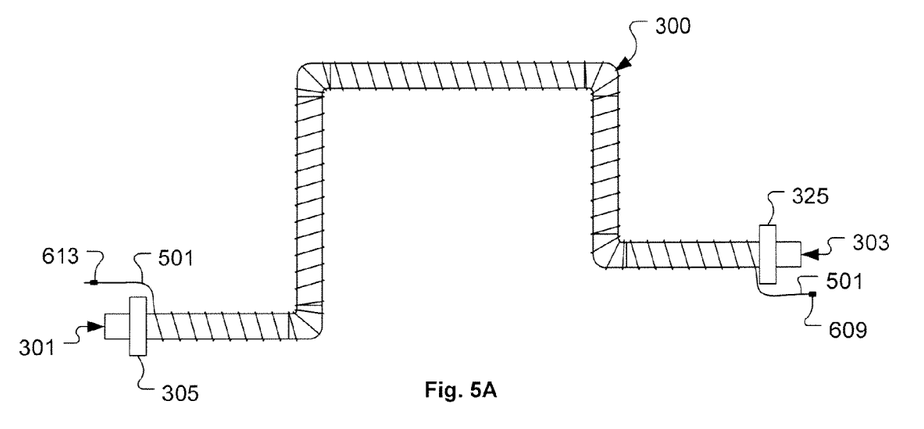
FIG. 5A shows an example of having performed the operation to wind an electrical resistance heating filament wire around the tubing assembly.

The method of FIG. 2 continues with an operation 205 for winding an electrical resistance heating filament wire around the plurality of tubing structures in an unbroken manner from the fluid entrance of the plurality of tubing structures to the fluid exit of the plurality of tubing structures. FIG. 5A shows an example of having performed operation 205 to wind an electrical resistance heating filament wire 501 around the tubing assembly 300. The electrical resistance heating filament wire 501 is formed of a material that will heat up when an electrical current is applied to flow through the electrical resistance heating filament wire 501. In some embodiments, the electrical resistance heating filament wire 501 is formed of Nichrome, which is a non-magnetic alloy of nickel and chromium having a high resistivity and resistance to oxidation at high temperature. In some embodiments, the electrical resistance heating filament wire 501 is formed of Constantan, which is a copper-nickel alloy having a substantially constant resistivity over a broad range of temperature. In some embodiments, the electrical resistance heating filament wire 501 is formed of Kanthal™, such as Alloy 875/815, which is a family of alloys of iron-chromium-aluminum having intermediate electrical resistance and an ability to withstand high temperatures. In some embodiments, the electrical resistance heating filament wire 501 is formed of Evanohm (Alloy 800), Advance™ (Cupron or Alloy 45), Midohm™ (Alloy 180), Balco (Alloy 120), Alloy 30, Alloy 60, and/or Alloy 90, among others.

Figure 6A:
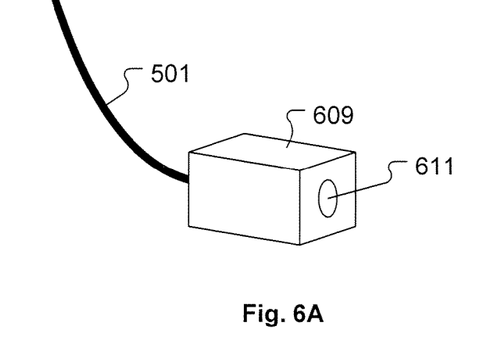
FIG. 6A shows the electrical lead as having a single receptacle for receiving a complementary shaped prong.
Figure 6B:
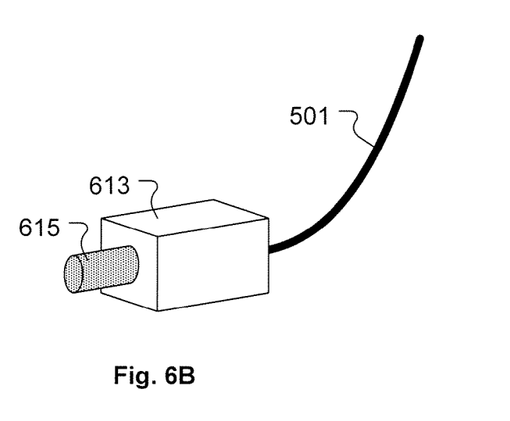
FIG. 6B shows the electrical lead as having a single prong shaped for insertion into the receptacle of the electrical lead.

In some embodiments, the electrical resistance heating filament wire is wound around the plurality of tubing structures such that the electrical resistance heating filament wire has a first electrical lead located proximate to the fluid entrance of the plurality of tubing structures and a second electrical lead located proximate to the fluid exit of the plurality of tubing structures. For example, FIG. 5A shows an electrical lead 613 located proximate to the fluid entrance 301 and an electrical lead 609 located proximate to the fluid exit 303. The electrical leads connected to the ends of the electrical resistance heating filament wires can be of many different configurations. For example, FIG. 6A shows the electrical lead 609 as having a single receptacle 611 for receiving a complementary shaped prong. The receptacle 611 is electrically connected to the electrical resistance heating filament wire 501 such that electrical continuity is established between the complementary shaped prong and the electrical resistance heating filament wire 501 upon insertion of the complementary shaped prong into the receptacle 611. FIG. 6B shows the electrical lead 613 as having a single prong 615 shaped for insertion into the receptacle 611 of the electrical lead 609. The prong 615 is electrically connected to the electrical resistance heating filament wire 501. The electrical leads 609 and 613 are formed of a material capable of withstanding the temperatures to which the electrical resistance heating filament wire 501 is raised during operation. In some example embodiments, the electrical leads 609 and 613 are formed of ceramic or other suitable heat resistant material such as plastic, among others. Also, in some embodiments, the electrical leads 609 and 613 are formed to clip/secure to each other when connected.

In some embodiments, the method of FIG. 2 can include a variation of the operation 205 in which two electrical resistance heating filament wires are wound around the plurality of tubing structures in an unbroken manner from the fluid entrance of the plurality of tubing structures to the fluid exit of the plurality of tubing structures. In some embodiments, the two electrical resistance heating filament wires are wound around the plurality of tubing structures at separate times, i.e., a first electrical resistance heating filament wire is wound around the plurality of tubing structures first, then a second electrical resistance heating filament wire is wound around the plurality of tubing structures. In some embodiments, both of the two electrical resistance heating filament wires are wound around the plurality of tubing structures at the same time, i.e., simultaneously.

Figure 5B:
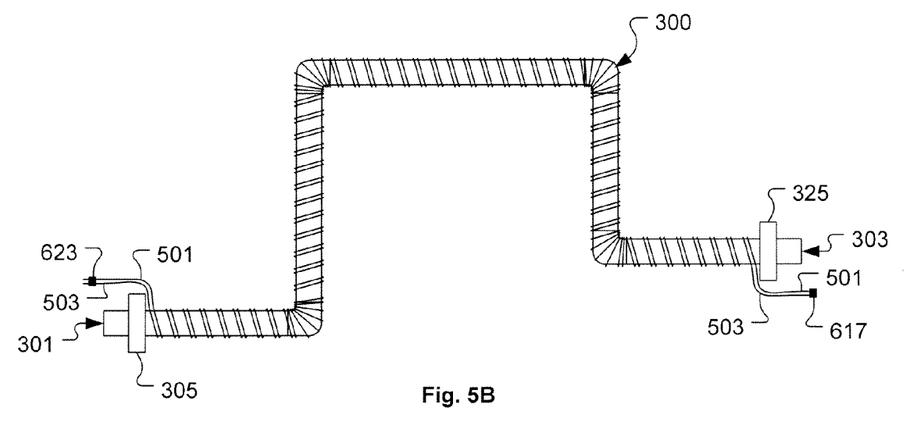
FIG. 5B shows an example of having performed the operation to wind two electrical resistance heating filament wires around the tubing assembly.

FIG. 5B shows an example of having performed operation 205 to wind two electrical resistance heating filament wires 501 and 503 around the tubing assembly 300. The electrical resistance heating filament wire 501 is the first electrical resistance heating filament wire. And, the electrical resistance heating filament wire 503 is the second electrical resistance heating filament wire. Each of the first and second electrical resistance heating filament wires 501 and 503 are wound around the plurality of tubing structures in an unbroken manner from the fluid entrance 301 to the fluid exit 303, such that the second electrical resistance heating filament wire 503 also has a first electrical lead located proximate to the fluid entrance 301 of the plurality of tubing structures and also has a second electrical lead located proximate to the fluid exit 303 of the plurality of tubing structures.

Figure 6C:
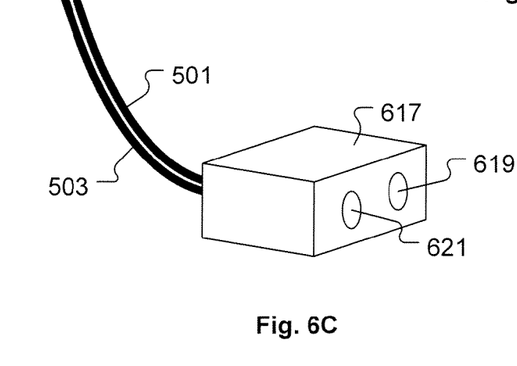
FIG. 6C shows the electrical lead as having two receptacles for receiving complementary shaped prongs.
Figure 6D:
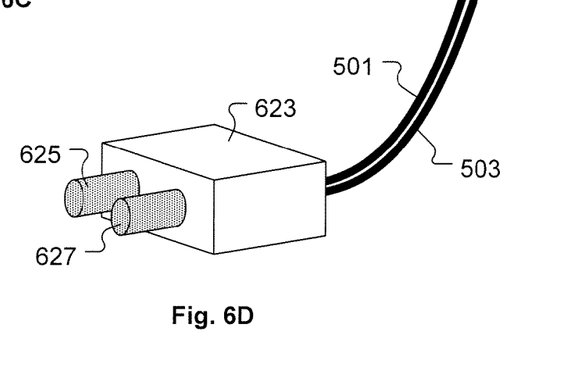
FIG. 6D shows the electrical lead as having two prongs shaped for insertion into the receptacles of the electrical lead.

For example, FIG. 6C shows the electrical lead 617 as having two receptacles 619 and 621 for receiving complementary shaped prongs. The receptacle 619 is electrically connected to the electrical resistance heating filament wire 501 such that electrical continuity is established between the complementary shaped prong and the electrical resistance heating filament wire 501 upon insertion of the complementary shaped prong into the receptacle 619. Similarly, the receptacle 621 is electrically connected to the electrical resistance heating filament wire 503 such that electrical continuity is established between the complementary shaped prong and the electrical resistance heating filament wire 503 upon insertion of the complementary shaped prong into the receptacle 621. FIG. 6D shows the electrical lead 623 as having two prongs 625 and 627 shaped for insertion into the receptacles 619 and 621, respectively, of the electrical lead 617. The prong 625 is electrically connected to the electrical resistance heating filament wire 501. Similarly, the prong 627 is electrically connected to the electrical resistance heating filament wire 503. The electrical leads 617 and 623 are formed of a material capable of withstanding the temperatures to which the electrical resistance heating filament wires 501 and 503 are raised during operation. In some example embodiments, the electrical leads 617 and 623 are formed of ceramic or other suitable heat resistant material such as plastic, among others. Also, in some embodiments, the electrical leads 617 and 623 are formed to clip/secure to each other when connected.

Figure 5C:
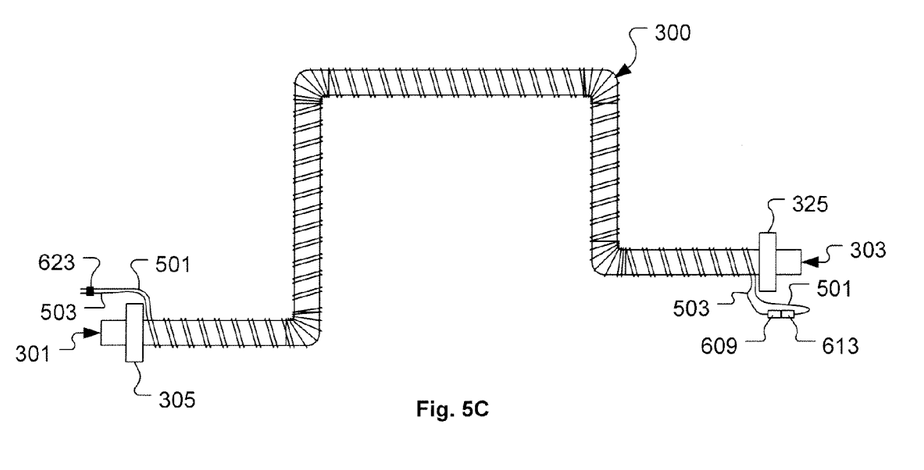
FIG. 5C shows the two electrical resistance heating filament wires wound around the tubing assembly, with the electrical leads of the two electrical resistance heating filament wires connected to each other near the fluid exit.

It should be appreciated that the electrical leads 609, 613, 617, and 623 can be utilized to establish electrical continuity between electrical resistance heating filament wires in separate tubing assemblies when the separate tubing assemblies are fit together within the semiconductor fabrication facility. Also, should be appreciated that the electrical leads 609, 613, 617, and 623 can be utilized to establish electrical continuity between different electrical resistance heating filament wires in the same tubing assembly. For example, FIG. 5C shows the two electrical resistance heating filament wires 501 and 503 wound around the tubing assembly 300, with the electrical leads of the two electrical resistance heating filament wires 501 and 503 connected to each other near the fluid exit 303. Specifically, the electrical resistance heating filament wire 501 has the electrical lead 613 connected to the electrical lead 609 of the electrical resistance heating filament wire 503. In this manner, a continuous electrical circuit is formed through the two electrical resistance heating filament wires 501 and 503, such that the electrical lead 623 can be connected to a power supply to supply electric current through the two electrical resistance heating filament wires 501 and 503.

In view of the foregoing, it should be understood that the winding of two electrical resistance heating filament wires 501 and 503 around the tubing assembly 300 provides for electrical connection of the first electrical leads of the first and second electrical resistance heating filament wires 501 and 503 to each other at a location proximate to the fluid entrance 301, or for electrical connection of the second electrical leads of the first and second electrical resistance heating filament wires 501 and 503 to each other at a location proximate to the fluid exit 303, and for electrical connection of each of the first and second electrical leads of the first and second electrical resistance heating filament wires 501 and 503 that are not connected to another of the first and second electrical leads of the first and second electrical resistance heating filament wires 501 and 503 to an electrical power source.

Also, if the optional operation 203 is performed to apply the layer of the dielectric material onto the plurality of tubing structures before winding of electrical resistance heating filament wire around the plurality of tubing structures in operation 205, the one or more electrical resistance heating filament wire(s) is/are wound around the plurality of tubing structures in the operation 205 so as to be in contact with an exposed surface of the layer of the dielectric material. Also, in some embodiments, the electrical resistance heating filament wire itself can be formed with an outer insulator layer which provides electrical resistance while also providing sufficient thermal conductivity to allow for transfer of heat from the electrical resistance heating filament wire to the plurality of tubing structures. In some embodiments where the electrical resistance heating filament wire has an outer insulator layer, the optional operation 203 may not be performed, such that the electrical resistance heating filament wire having the outer insulator layer is wound directly onto the plurality of tubing structures, such as shown in FIGS. 5A-5C.

Figure 7:
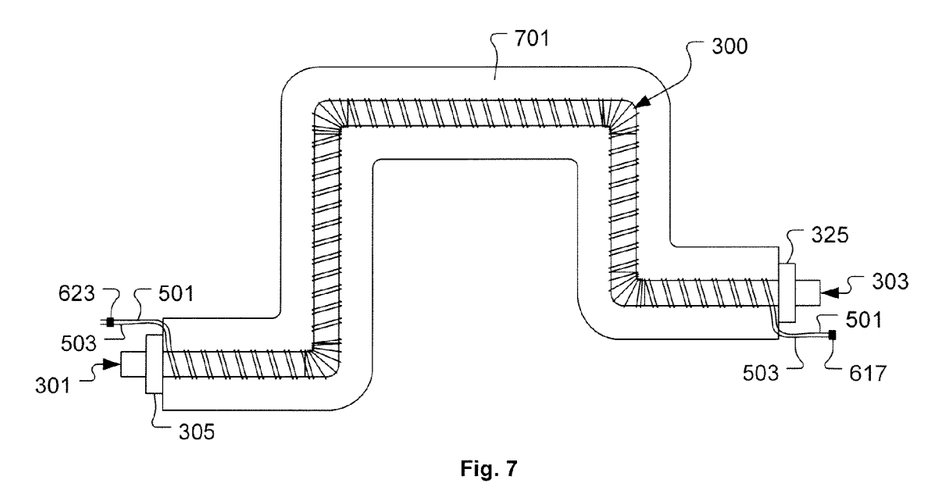
FIG. 7 shows an encapsulation layer of thermal insulating material disposed over an entirety of the plurality of tubing structures of the tubing assembly so as to cover the electrical resistance heating filament wires as wound around the plurality of tubing structures and so as to leave the first and second electrical leads exposed.

With reference back to FIG. 2, the method proceeds from the operation 205 to an operation 207 for applying an encapsulation layer of thermal insulating material over an entirety of the plurality of tubing structures in a manner to cover the electrical resistance heating filament wire(s) as wound around the plurality of tubing structures in the operation 205, and leave the first and second electrical leads exposed, i.e., not covered by the encapsulation layer of thermal insulating material. For example, FIG. 7 shows an encapsulation layer of thermal insulating material 701 disposed over an entirety of the plurality of tubing structures of the tubing assembly 300 so as to cover the electrical resistance heating filament wires 501 and 503 as wound around the plurality of tubing structures and so as to leave the first and second electrical leads 623 and 617 exposed. In various embodiments, the encapsulation layer of thermal insulating material 701 applied in the operation 207 can be formed of silicon rubber or other type of synthetic material containing a low amount of volatile organic compounds (VOCs) and/or having a pore size that will not trap VOCs, among others. In some embodiments, the encapsulation layer of thermal insulating material 701 applied in the operation 207 can be formed of foam structures, rubber structures, and/or silicon structures, having low VOC content, among others. In various embodiments, the encapsulation layer of thermal insulating material 701 can be applied in the operation 207 to have a thickness with a range extending from about 1 millimeter (mm) to about 14 mm. In some embodiments, the encapsulation layer of thermal insulating material 701 can be applied in the operation 207 to have a thickness of about 6.35 mm.

Figure 8:
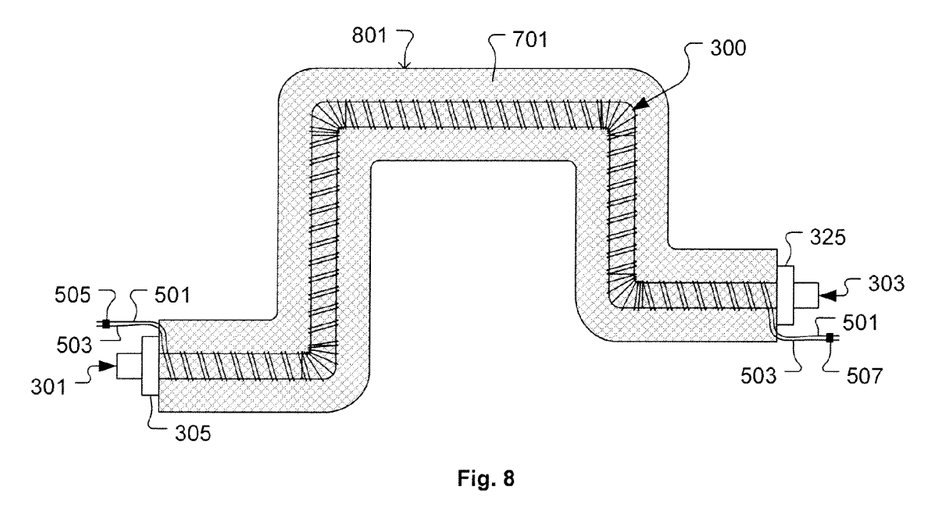
FIG. 8 shows the tubing assembly of FIG. 7 with a layer of abrasion resistant material applied over the encapsulation layer of thermal insulating material.

Also, the method can include an optional operation 209 for applying a layer of an abrasion resistant material over the encapsulation layer that was applied in operation 207. In some embodiments, the operation 209 is performed to apply the layer of abrasion resistant material over portions of the encapsulation layer where abrasion resistance is required once the tubing assembly is fit up within the semiconductor fabrication facility. In some embodiments, the operation 209 is performed to apply the layer of abrasion resistant material over an entirety of the encapsulation layer. For example, FIG. 8 shows the tubing assembly 300 of FIG. 7 with a layer of abrasion resistant material 801 applied over the encapsulation layer of thermal insulating material 701. In various embodiments, the layer of abrasion resistant material 801 applied in the operation 209 can be formed of flexible material, such as polyimide, nylon, silicon, fiber-reinforced silicon, and/or Kevlar™, among others. In some embodiments, the layer of abrasion resistant material 801 applied in the operation 209 can be formed as a jacket covering or as a mesh sleeve or as a tube. In various embodiments, the layer of abrasion resistant material 801 can be applied in the operation 209 to have a thickness with a range extending from about 50 microns to about 400 microns. In some embodiments, the layer of abrasion resistant material 801 can be applied in the operation 209 to have a thickness up to about 5 mm.

In some embodiments, a substantially straight and bendable tubing structure can be used in place of the plurality of tubing structures previously discussed with regard to FIG. 3. In these embodiments, the operations 203 through 209 of the method of FIG. 2 can be performed on the substantially straight and bendable tubing structure. Then, the tubing assembly as manufactured according to the method of FIG. 2 using the substantially straight and bendable tubing structure can be bent into a shape required for its placement within the semiconductor fabrication facility. In these embodiments, each component of the tubing assembly, i.e., dielectric material (if used), electrical resistance heating filament wire, encapsulation layer, and abrasion resistant material layer (if used), is configured with sufficient flexibility to allow for the bending as required to shape the tubing assembly for its placement within the semiconductor fabrication facility. In some embodiments, the tubing assembly configuration is initially substantially straight and bendable. In some embodiments, the electrical resistance heating filament wire is wound around the plurality of tubing structures with the tubing assembly configuration substantially straight. In some embodiments, the tubing assembly configuration is bent into a final shape either after the electrical resistance heating filament wire is wound around the plurality of tubing structures or after the encapsulation layer of thermal insulating material is applied.

Figure 9:
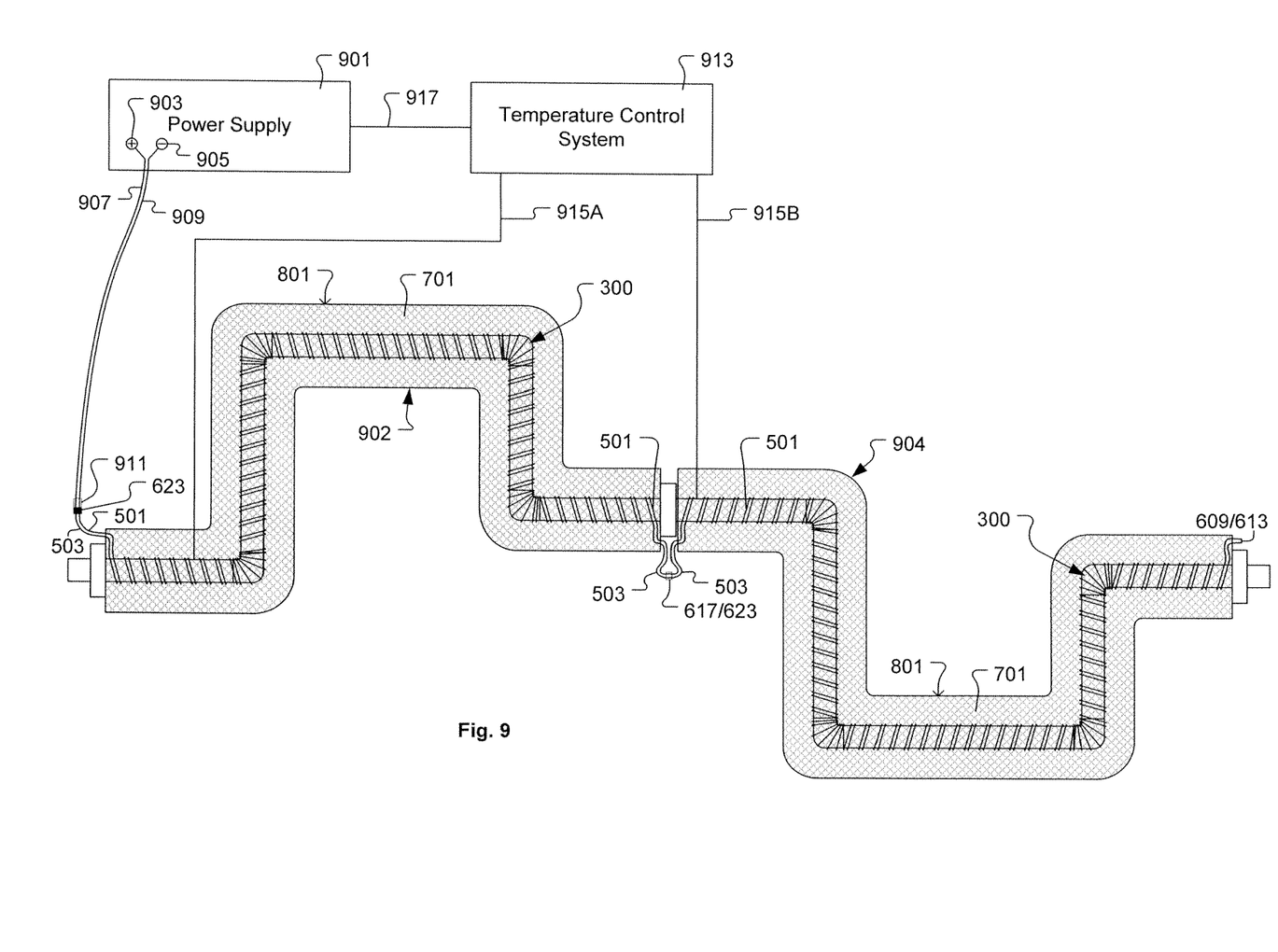
FIG. 9 shows an example fit up of tubing assemblies having integral heating components as manufactured in accordance with the method of FIG. 2.

FIG. 9 shows an example fit up of tubing assemblies having integral heating components as manufactured in accordance with the method of FIG. 2. Specifically, FIG. 9 shows a first tubing assembly 902 fit together with a second tubing assembly 904. For sake of description, each of the tubing assemblies 902 and 904 is like the tubing assembly 300 described with regard to FIGS. 2-8. It is envisioned that each of the tubing assemblies 902 and 904 is fabricated outside of the semiconductor fabrication facility and then fit together inside the semiconductor fabrication facility at or near their final place of installation. In the example configuration of FIG. 9, the electrical resistance heating filament wire 501 of the first tubing assembly 902 is electrically connected to the electrical resistance heating filament wire 501 of the second tubing assembly 904 through the electrical leads 617 and 623. Similarly, the electrical resistance heating filament wire 503 of the first tubing assembly 902 is electrically connected to the electrical resistance heating filament wire 503 of the second tubing assembly 904 through the electrical leads 617 and 623. Also, the electrical resistance heating filament wires 501 and 503 in the second tubing assembly 904 are electrically connected to each other by way of the electrical leads 609 and 613. And, the electrical resistance heating filament wires 501 and 503 in the first tubing assembly 902 are electrically connected to the two prongs, respectively, of the electrical lead 623, which is in turn electrically connected to a plug 911 of a power supply line.

The power supply line includes two separate electrical conductors 907 and 909 that run to a power supply 901. In the example of FIG. 9, the power supply 901 is a direct current (DC) power supply and includes a positive terminal 903 and a negative terminal 905. The electrical conductor 907 is electrically connected to the positive terminal 903, and the electrical conductor 909 is electrically connected to the negative terminal 905. The power supply 901 is defined to provide a flow of electric current through the electrical conductors 907, 909, 501, and 503 so as to cause heating of the two electrical resistance heating filament wires 501 and 503, which in turn causes heating of the tubing structures within each of the first and second tubing assemblies 902 and 904, which in turn causes heating of the fluid traveling through the first and second tubing assemblies 902 and 904. The power supply 901 is defined to provide the flow of electric current through the electrical conductors 907, 909, 501, and 503 in a controlled manner to as maintain a target temperature of the first and second tubing assemblies 902 and 904, and correspondingly of the fluid traveling through the first and second tubing assemblies 902 and 904. It should be understood that although the power supply 901 is shown as a DC power supply in the example embodiments of FIG. 9, in other embodiments the power supply 901 can be an alternating current (AC) power supply, with the positive and negative terminals 903 and 905 representing electrical terminals of the AC power supply.

FIG. 9 also shows that in some embodiments a temperature control system 913 can be implemented to provide for control of the temperature of the tubing assemblies 902 and 904. The temperature control system 913 can be connected to receive inputs from a number of thermocouple leads 915A, 915B (or essentially any other type of temperature sensing device) deployed to measure the temperature of the tubing assemblies 902 and 904. It should be appreciated that any number of temperature sensors can be deployed at any location on the tubing assemblies 902 and 904 as necessary to provide temperature inputs required for controlling the temperature of the fluid flowing through the tubing assemblies 902 and 904. The temperature control system 913 is configured to transmit control signals to the power supply 901, by way of connection 917, so as to control the power supply 901 based on the monitored temperature inputs (as received through 915A, 915B) so as to control the heating of the two electrical resistance heating filament wires 501 and 503 and thereby control the temperature of the fluid flowing through the tubing assemblies 902 and 904.

It should be understood that the example system depicted in FIG. 9 is a simplified example provided for descriptive purposes. In various embodiments, any number and any configuration of tubing assemblies as manufactured in accordance with the method of FIG. 2 can be fit together in the semiconductor fabrication facility. Also, in some embodiments, one or more power supplies, e.g., 901, can be connected to provide electrical power to any number of and any configuration of tubing assemblies as manufactured in accordance with the method of FIG. 2, so long as the power supply is capable of providing electrical power to the electrical resistance heating filament wires, e.g., 501 and 503, as necessary to appropriately heat the fluid flowing through the tubing assemblies.

Figure 10:
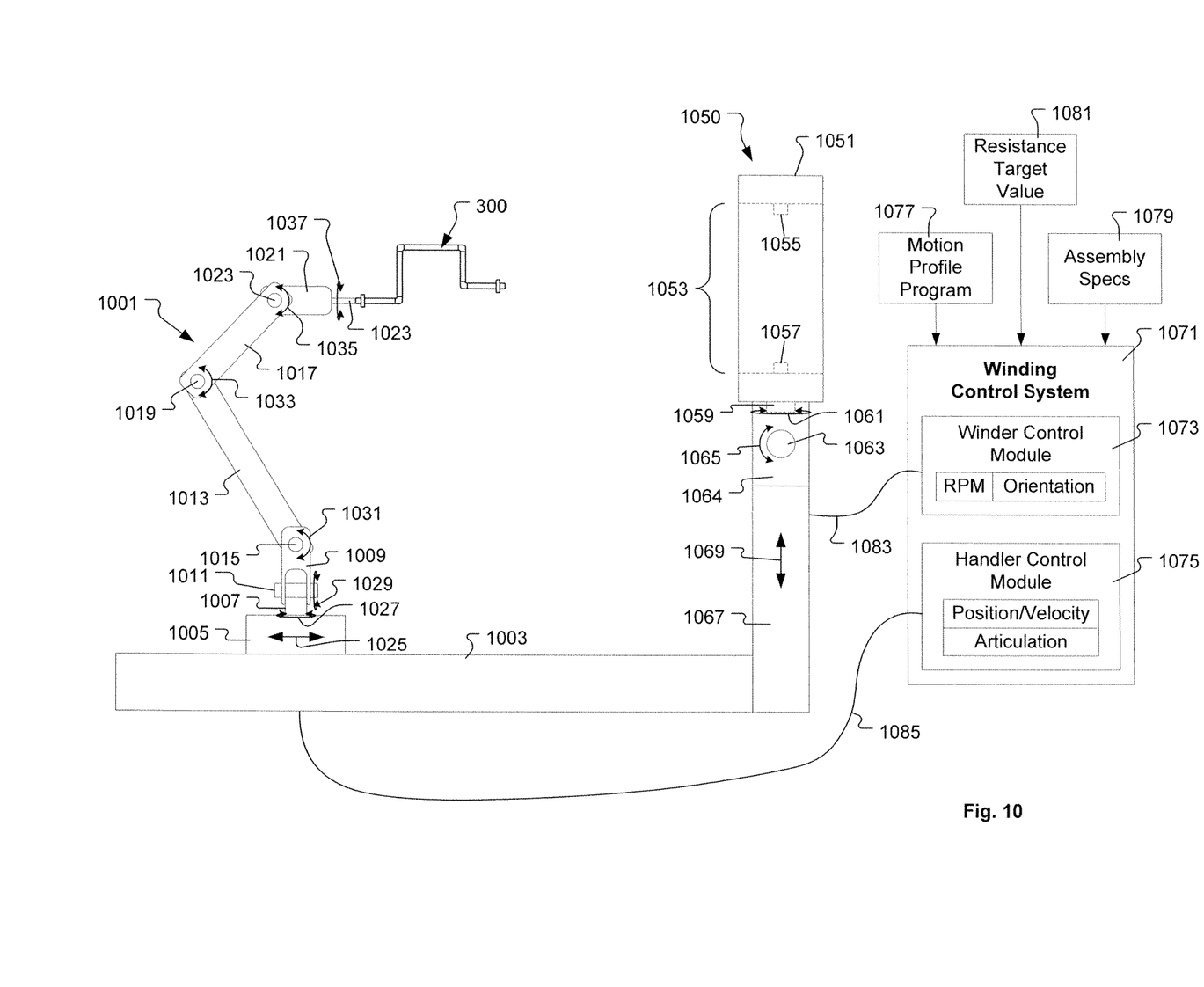
FIG. 10 shows an example system for manufacturing a tubing assembly according to the method of FIG. 2, in accordance with some embodiments of the present invention.

FIG. 10 shows an example system for manufacturing a tubing assembly according to the method of FIG. 2, in accordance with some embodiments of the present invention. The system of FIG. 10 includes a tubing assembly handling apparatus 1001, a winding apparatus 1050, and a winding control system 1071. The winding apparatus 1050 is configured to wind an electrical resistance heating filament wire around a tubing assembly, e.g., 300, as the tubing assembly is moved through the winding apparatus 1050. As discussed above, the tubing assembly, e.g., 300, includes a plurality of tubing structures connected to each other in a configuration providing one or more fluid pathways through the plurality of tubing structures from a fluid entrance of the plurality of tubing structures to a fluid exit of the plurality of tubing structures. Also, in some embodiments, the plurality of tubing structures includes at least two tubing structures that are connected within the tubing assembly at an angled configuration relative to each other such that an angle of less than 180 degrees exists between axial centerlines of the at least two tubing structures.

Figure 11:
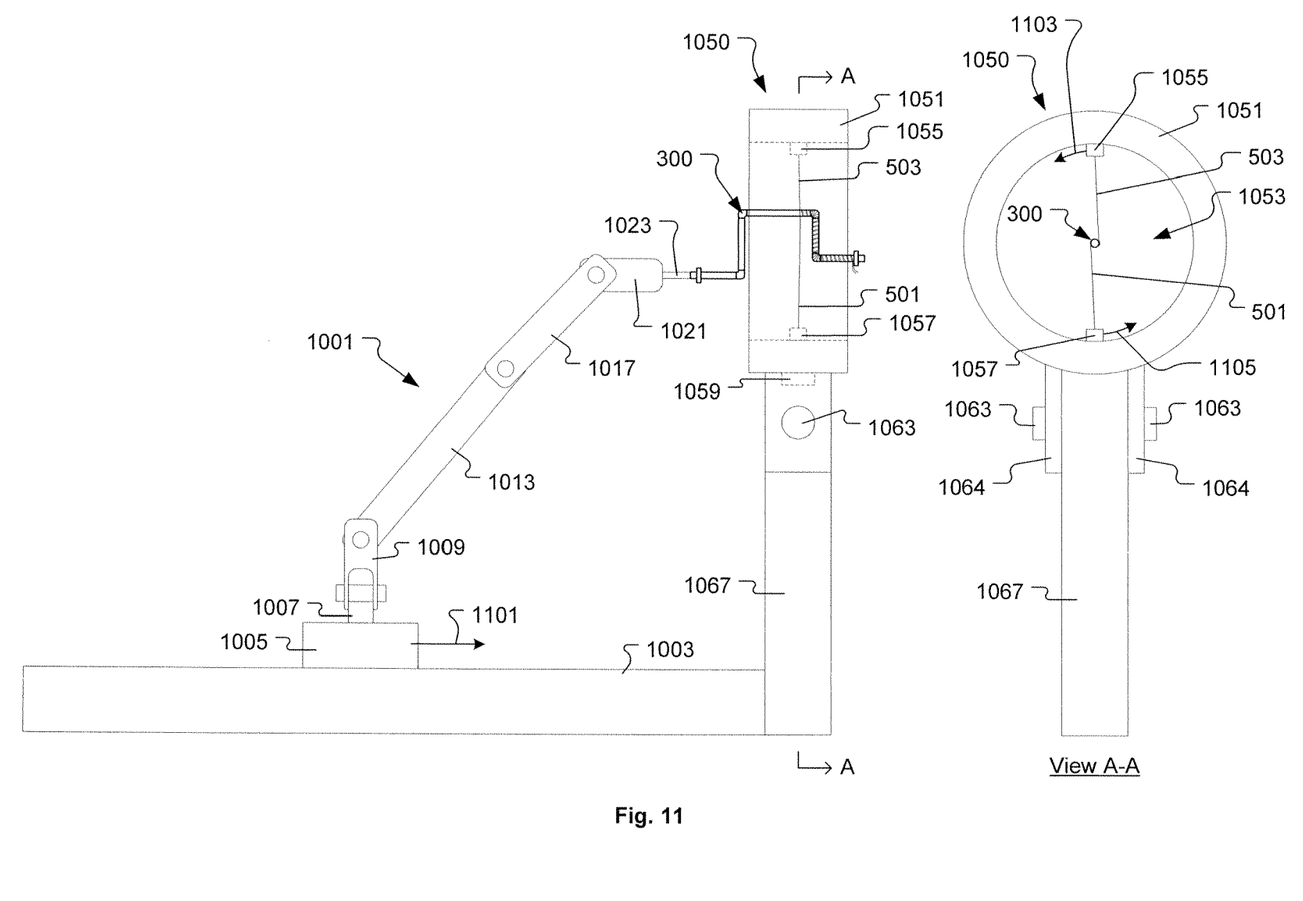
FIG. 11 shows the tubing assembly handling apparatus and the winding apparatus being operated in an automated manner under the control of the winding control system to wind the electrical resistance heating filament wires around the tubing assembly.

The winding apparatus 1050 includes an open bore 1053 within which the electrical resistance heating filament wire is wound around the tubing assembly as the tubing assembly passes through the open bore 1053. In the example of FIG. 10, the winding apparatus 1050 includes two wire dispense head 1055 and 1057 that are configured to rotate around the open bore 1053 while each simultaneously dispensing electrical resistance heating filament wire such that the electrical resistance heating filament wire wraps around the tubing assembly as it is moved through the open bore 1053. It should be understood, however, that in other embodiments the winding apparatus 1050 can include one dispense head, or more than two dispense heads. FIG. 11 shows a front view A-A of the winding apparatus 1050 with the dispense head 1055 moving in a direction 1103 around the open bore 1053 while simultaneously dispensing electrical resistance heating filament wire 503 so as to wrap around the tubing assembly 300. And, the front view A-A of the winding apparatus 1050 as shown in FIG. 11 also shows the dispense head 1057 moving in a direction 1105 around the open bore 1053 while simultaneously dispensing electrical resistance heating filament wire 501 so as to wrap around the tubing assembly 300.

In various embodiments, the winding apparatus 1050 includes a bore outer structure 1051 for housing the mechanics for rotating the dispense heads 1055 and 1057 around the open bore 1053. In some embodiments, the bore outer structure 1051 is rotatable by way of a pivot structure 1059, as indicated by arrows 1061, in order to change an azimuthal position of the bore outer structure 1051. Also, in some embodiments, the bore outer structure 1051 is connected to a support member 1064, which is rotatable by way of a pivot structure 1063, as indicated by arrows 1065, in order to change a tilt position of the bore outer structure 1051. Also, in some embodiments, the support member 1064 and/or bore outer structure 1051 is connected to a vertical support 1067, which can be moved vertically, as indicated by arrows 1069, in order to change a vertical position of the bore outer structure 1051.

The tubing assembly handling apparatus 1001 is configured to hold the tubing assembly 300 and direct movement of the tubing assembly 300 through the open bore 1053 of the winding apparatus 1050. The tubing assembly handling apparatus 1001 is a robotic handling system that is configured to position the tubing assembly 300 in any spatial orientation and move the tubing assembly 300 through the open bore 1053 of the winding apparatus 1050. It should be understood that the positioning and moving of the tubing assembly 300 as provided by the tubing assembly handling apparatus 1001 is done in a precisely controlled manner, and can be done in an automated manner.

In the example of FIG. 10, the tubing assembly handling apparatus 1001 includes a base 1005 that is mechanically linked to a drive track 1003, such that the base 1005 can be moved toward the winding apparatus 1050 and/or away from the winding apparatus 1050 in a controlled manner, as indicated by arrows 1025. The example tubing assembly handling apparatus 1001 includes a support structure 1007 connected to the base 1005. The support structure 1007 can be rotated in a controlled manner as indicated by arrows 1027. The example tubing assembly handling apparatus 1001 also includes a support structure 1009 connected to the support structure 1007 by way of pivot structure 1011, such that the support structure 1009 can be rotated about the pivot structure 1011 in a controlled manner, as indicated by arrows 1029. The example tubing assembly handling apparatus 1001 also includes a support structure 1013 connected to the support structure 1009 by way of pivot structure 1015, such that the support structure 1013 can be rotated about the pivot structure 1015 in a controlled manner, as indicated by arrows 1031. The example tubing assembly handling apparatus 1001 also includes a support structure 1017 connected to the support structure 1013 by way of pivot structure 1019, such that the support structure 1017 can be rotated about the pivot structure 1019 in a controlled manner, as indicated by arrows 1033. The example tubing assembly handling apparatus 1001 also includes a support structure 1021 connected to the support structure 1017 by way of pivot structure 1023, such that the support structure 1021 can be rotated about the pivot structure 1023 in a controlled manner, as indicated by arrows 1035. The example tubing assembly handling apparatus 1001 also includes a gripper structure 1023 configured to securely hold the tubing assembly 300. The gripper structure 1023 is connected to the support structure 1021. In various embodiments, the gripper structure 1023 can be rotated in a controlled manner as indicated by arrows 1037.

The winding control system 1071 is configured to control operation of the winding apparatus 1050 and the tubing assembly handling apparatus 1001. The winding control system 1071 is configured to control a rate at which the electrical resistance heating filament wire is wound around the tubing assembly 300 as the tubing assembly 300 passes through the open bore 1053 of the winding apparatus 1050. The winding control system 1071 is also configured to control a rate at which the tubing assembly 300 is moved through the open bore 1053 of the winding apparatus 1050. The winding control system 1071 is also configured to be programmable such that movement of the tubing assembly 300 through the open bore 1053 of the winding apparatus 1050 as the electrical resistance heating filament wire is wound around the tubing assembly 300 by the winding apparatus is performed in an automated manner in accordance with a program executed by the winding control system 1071.

The winding control system 1071 includes a winder control module 1073 and a handler control module 1075. The winder control module 1073 is configured to control all aspects of operation of the winding apparatus 1050 by way of control signals transmitted through a control connection 1083. For example, the winder control module 1073 is configured to control the rate or revolutions per minute (RPM) at which the dispense heads 1055 and 1057 rotate around the open bore 1053. And, the winder control module 1073 is configured to control the location and orientation of the bore outer structure 1051 by way of any of the available movement mechanisms such as the pivot structures 1059 and 1063 and the vertical support 1067.

The handler control module 1075 is configured to control all aspects of operation of the tubing assembly handling apparatus 1001 by way of control signals transmitted through a control connection 1085. For example, the handler control module 1075 is configured to control a position of the tubing assembly handling apparatus 1001 along the drive track 1003, as indicated by arrows 1025. The handler control module 1075 is also configured to control an acceleration and velocity of the tubing assembly handling apparatus 1001 along the drive track 1003, as indicated by arrows 1025. The handler control module 1075 is also configured to control articulation of the tubing assembly handling apparatus 1001 so as to position the tubing assembly 300 in any required orientation at any time. More specifically, the tubing assembly handling apparatus 1001, under the control of the handler control module 1075, is configured to control an orientation of the tubing assembly 300 as the tubing assembly 300 is moved through the open bore 1053 of the winding apparatus 1050 such that an axial centerline of a given tubing structure of the plurality of tubing sections of the tubing assembly 300 is maintained in a substantially perpendicular orientation relative to an entrance opening of the open bore 1053 of the winding apparatus 1050 as the given tubing structure passes through the open bore 1053 of the winding apparatus 1050.

The winding control system 1071 is further configured to automate the process of winding the electrical resistance heating filament wire around the plurality of tubing structures of the tubing assembly 300 in an unbroken manner from the fluid entrance to the fluid exit, as performed in operation 205 of the method of FIG. 2. The winding control system 1071 includes a computer system configured receive one or more inputs, including a motion profile program 1077, a resistance target value 1081, and/or a tubing assembly specification 1079. In some embodiments, the computer system of the winding control system 1071 is configured to operate both the tubing assembly handling apparatus 1001 and the winding apparatus 1050 in unison so as to follow the motion profile program 1077 received as input, which in turn causes the tubing assembly 300 to be moved and articulated through the open bore 1053 of the winding apparatus 1050 so as to wind the electrical resistance heating filament wire around the tubing assembly 300 in a prescribed manner. In some embodiments, the computer system of the winding control system 1071 is configured to operate both the tubing assembly handling apparatus 1001 and the winding apparatus 1050 in unison so as to move and articulate the tubing assembly 300 through the open bore 1053 of the winding apparatus 1050 based on the tubing assembly specification 1079 received as input, so as to wind the electrical resistance heating filament wire around the tubing assembly 300 in a prescribed manner. In some embodiments, the computer system of the winding control system 1071 is configured to operate both the tubing assembly handling apparatus 1001 and the winding apparatus 1050 in unison so as to achieve a desired density of the electrical resistance heating filament wire along the tubing section 300, or portion thereof, where the desired density of the electrical resistance heating filament wire is specified by the resistance target value 1081 (Ohms per unit length) received as input to the winding control system 1071.

It should be understood that in other embodiments the winding control system 1071 may include other control features that are not specifically shown in FIG. 10, but which contribute to controlling how the electrical resistance heating filament wire is wound around the tubing assembly 300. It should be further appreciated that the winding control system 1071, the tubing assembly handling apparatus 1001, and the winding apparatus 1050 provide for automated winding of the electrical resistance heating filament wire around essentially any configuration of tubing assembly. For example, FIG. 11 shows the tubing assembly handling apparatus 1001 and the winding apparatus 1050 being operated in an automated manner under the control of the winding control system 1071 to wind the electrical resistance heating filament wires 501 and 503 around the tubing assembly 300 in accordance with operation 205 of the method of FIG. 2. Specifically, the tubing assembly handling apparatus 1001 is moving in the direction 1101 toward the winding apparatus 1050 while holding the tubing assembly 300 in a fixed position, as the dispense heads 1055 and 1057 rotate in the directions 1103 and 1105, respectively, so as to wind the electrical resistance heating filament wires 503 and 501, respectively, around the tubing assembly 300.

Figure 12:
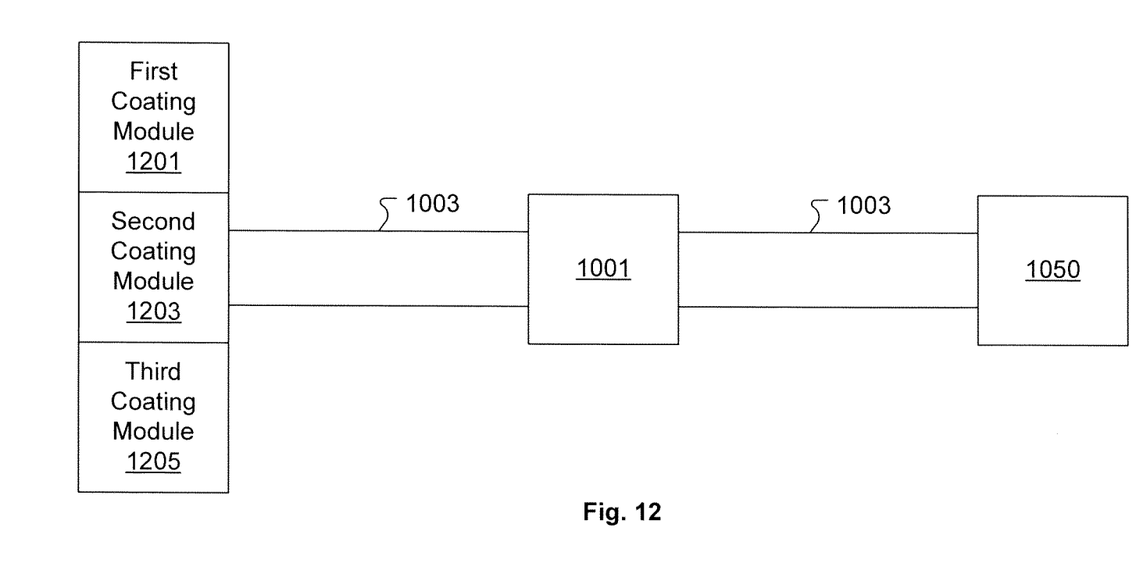
FIG. 12 shows a block diagram of a system in which the tubing assembly handling apparatus and the winding apparatus is deployed with a first coating module, a second coating module, and a third coating module, in accordance with some embodiments of the present invention.

FIG. 12 shows a block diagram of a system in which the tubing assembly handling apparatus 1001 and the winding apparatus 1050 is deployed with a first coating module 1201, a second coating module 1203, and a third coating module, in accordance with some embodiments of the present invention. The first coating module 1201 is configured to apply a layer of a dielectric material onto the tubing assembly 300 prior to movement of the tubing assembly through the open bore 1053 of the winding apparatus 1050, such as previously described with regard to optional operation 203 of the method of FIG. 2. The tubing assembly handling apparatus 1001 is configured to direct movement of the tubing assembly 300 during application of the layer of the dielectric material by the first coating module 1201. Similarly, the second coating module 1203 is configured to apply an encapsulation layer of thermal insulating material over the tubing assembly 300 after movement of the tubing assembly through the open bore 1053 of the winding apparatus 1050, such as previously described with regard to operation 207 of the method of FIG. 2. The tubing assembly handling apparatus 1001 is configured to direct movement of the tubing assembly 300 during application of the encapsulation layer of thermal insulating material by the second coating module 1203. The third coating module 1205 is configured to apply a layer of an abrasion resistant material onto the tubing assembly 300 after application of the encapsulation layer of thermal insulating material, such as previously described with regard to optional operation 209 of the method of FIG. 2. The tubing assembly handling apparatus 1001 is configured to direct movement of the tubing assembly 300 during application of the layer of an abrasion resistant material by the third coating module 1205.

It should be understood that the configuration of the tubing assembly handling apparatus 1001 and winding apparatus 1050 relative to the first coating module 1201, the second coating module 1203, and the third coating module 1205 as shown in FIG. 12 is provided by way of example. In other embodiments, the first coating module 1201, the second coating module 1203, and the third coating module 1205 can be positioned at essentially any locations, so long as the tubing assembly handling apparatus 1001 is capable of directing movement of the tubing assembly 300 through each of the first coating module 1201, the second coating module 1203, the third coating module 1205, and the winding apparatus 1050.

It should be appreciated that the method for manufacturing tubing assemblies with integral heating components as disclosed herein provides for relief of component crowding within tight spaces around and near the tubing assemblies when installed in the semiconductor fabrication facility. For example, by integrating heating components within the tubing assemblies, in the manner disclosed herein, the number of electrical connections for heating the tubing network is reduced, which thereby reduces component crowding that would have otherwise been caused by an excessive number of electrical connections. Also, by reducing the number of required electrical connections and correspondingly reducing the component crowding around and near where the tubing assemblies are to be installed within the semiconductor fabrication facility, the installation of the tubing assemblies having the integral heating components is simplified. Also, integration of the heating components with the tubing assemblies, as disclosed herein, lends itself to automation, as disclosed herein, which in turn can lead to reduced cost for temperature controlled tubing networks within the semiconductor fabrication facility.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A tubing assembly, comprising:
    a plurality of tubing structures connected to each other in a configuration providing one or more fluid pathways through the plurality of tubing structures from a fluid entrance of the plurality of tubing structures to a fluid exit of the plurality of tubing structures;
    an electrical resistance heating filament wire wound around the plurality of tubing structures in an unbroken manner from the fluid entrance of the plurality of tubing structures to the fluid exit of the plurality of tubing structures, the electrical resistance heating filament wire having a first electrical lead located proximate to the fluid entrance of the plurality of tubing structures and a second electrical lead located proximate to the fluid exit of the plurality of tubing structures;
    a layer of a dielectric material disposed on the plurality of tubing structures, the electrical resistance heating filament wire wound around the plurality of tubing structures so as to be in contact with an exposed outer surface of the layer of the dielectric material; and
    an encapsulation layer of thermal insulating material disposed over an entirety of the plurality of tubing structures and covering the electrical resistance heating filament wire wound around the plurality of tubing structures with the first and second electrical leads exposed.

2. The tubing assembly as recited in claim 1, wherein the plurality of tubing structures are welded together to provide the one or more fluid pathways through the plurality of tubing structures.

3. The tubing assembly as recited in claim 1, wherein the plurality of tubing structures includes at least two tubing structures that are connected within the tubing assembly at an angled configuration relative to each other such that an angle of less than 180 degrees exists between axial centerlines of the at least two tubing structures.

4. The tubing assembly as recited in claim 1, further comprising:
    a layer of an abrasion resistant material disposed over the encapsulation layer.

5. The tubing assembly as recited in claim 1, wherein the electrical resistance heating filament wire wound around the plurality of tubing structures from the fluid entrance to the fluid exit is a first electrical resistance heating filament wire, the tubing assembly including a second electrical resistance heating filament wire wound around the plurality of tubing structures in an unbroken manner from the fluid entrance to the fluid exit, the second electrical resistance heating filament wire having a first electrical lead located proximate to the fluid entrance and a second electrical lead located proximate to the fluid exit, the encapsulation layer of thermal insulating material disposed to cover both the first and second electrical resistance heating filament wires with the first and second electrical leads of both the first and second electrical resistance heating filament wires exposed.

6. The tubing assembly as recited in claim 5, wherein either the first electrical leads of the first and second electrical resistance heating filament wires are electrically connected to each other at a location proximate to the fluid entrance, or the second electrical leads of the first and second electrical resistance heating filament wires are electrically connected to each other at a location proximate to the fluid exit.

7. The tubing assembly as recited in claim 6, wherein each of the first and second electrical leads of the first and second electrical resistance heating filament wires that are not connected to another of the first and second electrical leads of the first and second electrical resistance heating filament wires is configured for connection to an electrical power source.

8. A method for manufacturing a tubing assembly, comprising:
    connecting a plurality of tubing structures together in a tubing assembly configuration providing one or more fluid pathways through the plurality of tubing structures from a fluid entrance of the plurality of tubing structures to a fluid exit of the plurality of tubing structures;
    winding an electrical resistance heating filament wire around the plurality of tubing structures in an unbroken manner from the fluid entrance of the plurality of tubing structures to the fluid exit of the plurality of tubing structures, such that the electrical resistance heating filament wire has a first electrical lead located proximate to the fluid entrance of the plurality of tubing structures and a second electrical lead located proximate to the fluid exit of the plurality of tubing structures;
    applying a layer of a dielectric material onto the plurality of tubing structures before winding the electrical resistance heating filament wire around the plurality of tubing structures, such that the electrical resistance heating filament wire is wound around the plurality of tubing structures so as to be in contact with an exposed outer surface of the layer of the dielectric material; and applying an encapsulation layer of thermal insulating material over an entirety of the plurality of tubing structures in a manner to cover the electrical resistance heating filament wire as wound around the plurality of tubing structures and leave the first and second electrical leads exposed.

9. The method for manufacturing the tubing assembly as recited in claim 8, wherein connecting the plurality of tubing structures together includes welding the plurality of tubing structures together.

10. The method for manufacturing the tubing assembly as recited in claim 8, wherein the plurality of tubing structures includes at least two tubing structures that are connected within the tubing assembly at an angled configuration relative to each other such that an angle of less than 180 degrees exists between axial centerlines of the at least two tubing structures.

11. The method for manufacturing the tubing assembly as recited in claim 8, further comprising:

applying a layer of an abrasion resistant material over the encapsulation layer.

12. The method for manufacturing the tubing assembly as recited in claim 8, wherein the electrical resistance heating filament wire wound around the plurality of tubing structures from the fluid entrance to the fluid exit is a first electrical resistance heating filament wire, the method including winding a second electrical resistance heating filament wire around the plurality of tubing structures in an unbroken manner from the fluid entrance to the fluid exit, such that the second electrical resistance heating filament wire has a first electrical lead located proximate to the fluid entrance of the plurality of tubing structures and a second electrical lead located proximate to the fluid exit of the plurality of tubing structures, and such that the encapsulation layer of thermal insulating material is applied to cover both the first and second electrical resistance heating filament wires and leave the first and second electrical leads of both the first and second electrical resistance heating filament wires exposed.

13. The method for manufacturing the tubing assembly as recited in claim 12, further comprising:

electrically connecting the first electrical leads of the first and second electrical resistance heating filament wires to each other at a location proximate to the fluid entrance, or electrically connecting the second electrical leads of the first and second electrical resistance heating filament wires to each other at a location proximate to the fluid exit, and electrically connecting each of the first and second electrical leads of the first and second electrical resistance heating filament wires that are not connected to another of the first and second electrical leads of the first and second electrical resistance heating filament wires to an electrical power source.

14. The method for manufacturing the tubing assembly as recited in claim 8, wherein the tubing assembly configuration is initially substantially straight and bendable, wherein the electrical resistance heating filament wire is wound around the plurality of tubing structures with the tubing assembly configuration substantially straight, and wherein the method includes bending of the tubing assembly configuration into a final shape either after the electrical resistance heating filament wire is wound around the plurality of tubing structures or after the encapsulation layer of thermal insulating material is applied.

* * * * *